(12) United States Patent
Bayer et al.

(10) Patent No.: US 7,255,926 B2
(45) Date of Patent: Aug. 14, 2007

(54) BARRIER LAYER MADE OF A CURABLE RESIN CONTAINING POLYMERIC POLYOL

(75) Inventors: Heiner Bayer, Olching (DE); Hermann Calwer, München (DE); Dieter Dlugosch, Heilsbronn (DE); Gudrun Kühne, München (DE)

(73) Assignee: Shell Oil Company, Houston, TX (US)

( * ) Notice: Subject to any disclaimer, the term of this patent is extended or adjusted under 35 U.S.C. 154(b) by 349 days.

(21) Appl. No.: 10/503,165

(22) PCT Filed: Jan. 31, 2003

(86) PCT No.: PCT/EP03/01073

§ 371 (c)(1),
(2), (4) Date: Jul. 30, 2004

(87) PCT Pub. No.: WO03/064529

PCT Pub. Date: Aug. 7, 2003

(65) Prior Publication Data

US 2005/0072459 A1 Apr. 7, 2005

(30) Foreign Application Priority Data

Feb. 1, 2002 (DE) .............................. 102 04 049

(51) Int. Cl.
*B32B 17/10* (2006.01)

(52) U.S. Cl. ...................... 428/437; 136/252; 136/264; 136/265

(58) Field of Classification Search ................ 428/437; 136/252, 264, 265
See application file for complete search history.

(56) References Cited

U.S. PATENT DOCUMENTS

| | | | |
|---|---|---|---|
| 4,193,799 A | 3/1980 | Crivello | 430/319 |
| 4,719,255 A | 1/1988 | Yoshizumi et al. | 523/436 |
| 5,242,715 A | 9/1993 | Schoen et al. | 427/386 |
| 5,354,939 A | 10/1994 | Hollstein et al. | 523/206 |
| 5,602,457 A * | 2/1997 | Anderson et al. | 320/102 |
| 5,631,315 A * | 5/1997 | D'Errico | 524/314 |
| 6,204,443 B1 | 3/2001 | Kiso et al. | 136/259 |
| 6,288,326 B1 | 9/2001 | Hayashi et al. | 136/251 |
| 2003/0140961 A1* | 7/2003 | Damson et al. | 136/244 |

FOREIGN PATENT DOCUMENTS

| | | |
|---|---|---|
| DE | 3013037 A | 10/1981 |
| DE | 263647 A1 | 1/1989 |
| DE | 4442824 | 1/1996 |
| DE | 19514908 | 4/1996 |
| DE | 19707280 | 8/1998 |
| DE | 19943149 | 4/2001 |
| EP | 0 233 358 | 8/1987 |
| EP | 0 527 107 A1 | 2/1993 |
| EP | 0764690 | 3/1997 |
| EP | 0 843 509 A1 | 5/1998 |
| EP | 0 903 790 A2 | 3/1999 |

OTHER PUBLICATIONS

International Search Report dated Apr. 29, 2003.

* cited by examiner

*Primary Examiner*—D. S Nakarani

(57) ABSTRACT

A component involving a substrate, a layered structure arranged on the substrate, and a barrier layer arranged over the layered structure, wherein the barrier layer has the reaction product of an epoxy resin and a polymeric polyol.

21 Claims, 1 Drawing Sheet

BARRIER LAYER MADE OF A CURABLE RESIN CONTAINING POLYMERIC POLYOL

The invention relates to a component comprising a substrate and a layered structure arranged on the substrate, wherein the layered structure is sensitive to moisture and should be protected. In order to protect the layered structure, the component further comprises a barrier layer that covers the layered structure. The barrier layer is also called a capping layer. As a layer that is sensitive to moisture may as well be sensitive to corrosion, the expression 'sensitive to moisture' is used to refer to 'sensitive to moisture', 'sensitive to corrosion', or to 'sensitive to both moisture and corrosion'.

An example of a component to which the invention relates is a component wherein the layered structure includes an optically or an electrically active thin film, such as a radiation detector, a solar cell or a solar module, or an optoelectronical component, such as a light emitting displaying device and a liquid crystal display (LCD) screen.

Among the solar cells, thin film solar cells take a particular prominent position. Thin film solar cells represent a significant progress in the technology, since they can be manufactured essentially more cost-effectively than conventional solar cells. The thin film technology is based upon the direct deposition of an absorber layer having a thickness of 0.002 mm on a substrate. The layered structure further includes a molybdenum back electrode on the substrate and a front electrode on the absorber layer. A series connection for increasing the module voltage is integrated in the manufacturing process, and in this way expensive soldering procedures are avoided. The absorber layer is the layer that is sensitive to moisture. However, not only the absorber layer is vulnerable, also the electrodes are sensitive to moisture.

A suitable thin-film absorber layer includes copper-indium-diselenide ($CuInSe_2$, in short: CIS). The CIS technology has particular favourable perspectives to achieve a high efficiency, good long-term stability and low costs. A suitable substrate is float glass. The maximum efficiencies of 17 to 18% achieved are the highest among all thin film cells. Even more than these values, achieved in single cases with small cells, module efficiencies of up to 14% demonstrate the potential of this technology. Another advantage lies in the fact that the layers that can be manufactured in large panels, are cut by lasers and automatically connected to modules thereafter by the integrated series connections.

In order to meet the quality demands of the market, solar modules must successfully run through a series of different test procedures. One of these procedures, which should test the climate resistance of the solar modules, is the damp-heat test. In this test the modules are exposed to a temperature of 85° C. at 85% relative air humidity for 1 000 hours, according to the known standard IEC 1215.

When a moisture-sensitive layer is subjected to moisture its sheet resistance increases, and the quality of the encapsulation determines the increase in sheet resistance.

The sheet resistance, $\rho_s$ in ohms, is a measure of the resistance of a thin layer of material looking edge-on into the layer. In equation: $\rho_s = \rho/t$, wherein t is the thickness of the layer in cm, and wherein $\rho$ is the resistivity of the material in ohms·cm, which resistivity is defined as $\rho = RA/l$, wherein R is the resistance of the layer in ohms, A the cross-sectional area of the layer in $cm^2$ and l the length of the layer in cm.

Reducing the sensitivity to moisture of a component cannot be achieved by simple encapsulation with a laminate arrangement including an adhesive foil and, possibly, a second glass plate.

One possibility to avoid the diffusion of moisture into a laminated layered structure, in particular into a solar module, is to make the path for moisture diffusion longer. This requires a sufficiently broad edge or rim of more than 15 cm. Such a broad edge or rim, however, is not acceptable in a solar module, because the rim considerably reduces the active module surface.

Another solution is disclosed in German patent application publication No. 197 07 280. This solution is providing an inorganic barrier layer that is selected from the group consisting of $Al_2O_3$, $Si_3N_4$, TiN, MoN and $SiO_xN_y$.

German patent specification No. 195 14 908 discloses a component comprising a substrate and a layered structure arranged on the substrate, and a barrier layer arranged over the layered structure, wherein the barrier layer comprises the reaction product of a polyisocyanate and a trifunctional polyol based on trimethyl propane. This is a conventional polyurethane system.

The present invention provides a component that is insensitive to moisture, which can be manufactured more easily than an inorganic barrier and without high additional manufacturing expenses, and which demonstrates an increased stability against the test conditions described above, as well as during normal operation.

To this end the component according to the present invention comprises a substrate, a layered structure arranged on the substrate, and a barrier layer arranged over the layered structure, wherein the barrier layer comprises the reaction product of a polymeric polyol and a curable resin, characterized in that the curable resin is an epoxy resin.

In the specification and in the claims, the expression 'curable resin' will be used to refer to a cross-linking resin, a thermosetting resin or a vulcanizable resin.

Reference is now made to European patent application publication No. 903 790. This publication discloses a component comprising a substrate and a layered structure arranged on the substrate, and a top encapsulating material arranged over the layered structure, wherein the top encapsulating material comprises polyolefin-based resins, such as ethylene-vinyl acetate copolymer, ethylene-methylacrylate copolymer, ethylene-ethylacrylate copolymer, and polyvinyl butyral resin, urethane resin, silicone resin and fluororesin. The bottom encapsulating material comprises ethylene-vinyl acetate or polyvinyl butyral.

Reference is further made to U.S. Pat. No. 6,204,443. This publication discloses a component comprising a substrate and a layered structure arranged on the substrate, and a surface side filler arranged over the layered structure, wherein the surface side filler comprises a layer of a non-cross-linked polymer resin (ethylene-vinyl acetate copolymer, polyvinyl butyral, epoxy resins, acrylic resins, silicone resins and fluoro resins) that is sandwiched between two layers of a cross-linked resin. The cross-linking agent is an isocyanate, a melamine or an organic peroxide.

Moreover, reference is made to U.S. Pat. No. 6,288,326. This publication discloses a component comprising a substrate and a layered structure arranged on the substrate, and an encapsulation arranged over the layered structure, wherein the encapsulation comprises ethylene-vinyl acetate and polyisobutylene resin.

The invention will now be described by way of example in more detail with reference to the accompanying drawings, wherein FIG. 1 shows schematically and not to scale a cross-section of a component according to the present invention;

Figure 1:
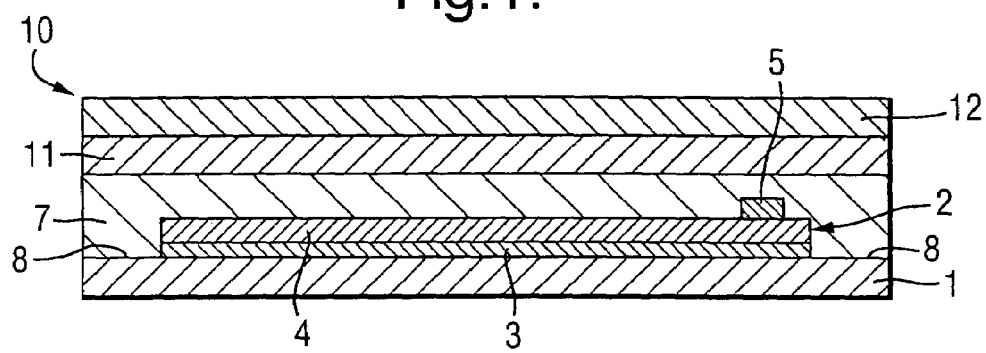

Reference is now made to FIG. 1. The component according to the present invention comprises a substrate 1, on which is deposited a layered structure 2. The layered structure includes a back electrode 3 deposited on the substrate 1, an absorber layer 4 deposited on the back electrode 3 at least one front electrode 5 arranged on the light-receiving surface of the absorber layer 4.

The component according to the present invention further includes a barrier layer 7 comprising the reaction product of a curable resin and a polymeric polyol. The barrier layer 7 extends over the outer surface of the layered structure 2 and ends on rims 8 of the substrate 1. The thickness of the barrier layer is suitably in the range of from 100 nm to 2 mm.

To complete covering the component a conventional laminate is applied. The laminate consists of a cover 10 of transparent glass 12 and an adhesive layer 11, by which the laminate is adhered to the barrier layer 7. The adhesive layer 11 is suitably a layer consisting of polyvinyl butyral having a thickness of 0.5 mm. The laminate is applied at a temperature of 150° C.

For the sake of simplicity we did not show the electric contacts that are attached to the back electrode 3 and the front electrode 5 to carry away the current generated during normal operation.

The way in which the barrier layer is formed from a liquid resin composition containing a curable resin and a polymeric polyol is discussed at a later stage.

The barrier layer according to the present invention is not only moisture proof, but also it adheres so well to the substrate that diffusion of moisture along the interfaces at the rims 8 between the substrate 1 and the barrier layer 7 is prevented. Applicant had found that diffusion of moisture through the barrier layer itself was insignificant as compared to diffusion of moisture along the interfaces between the barrier layer and the substrate.

The barrier layer according to the present invention comprises the reaction product of a curable resin and a polymeric polyol. The barrier layer is obtained by applying a liquid resin composition containing the curable resin and the polymer polyol on the surfaces of the component to be covered, and then allowing the polymer polyol to react with the resin.

Application of the liquid resin composition can be done by spraying, brushing, dipping, and a spin on method, screen printing and so on.

For application the liquid resin composition can further be diluted with a solvent, for example for spraying or brush application, with ethoxypropyl acetate.

After application of the liquid resin composition, the reaction between the polymeric polyol and the curable resin is allowed to proceed.

The polymeric polyol is a higher molecular polyol, in particular with a molar mass of about 1 000 or higher. Examples of the polymeric polyol are polyvinyl alcohol, a polyester- and/or a polyether polyol.

Figure 2:
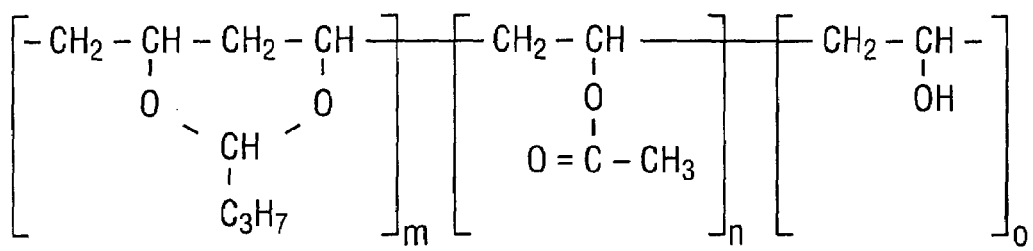
FIG. 2 shows the structural formula of polyvinyl butyral.

A particularly suitable polymer polyol is polyvinyl butyral (PVB) of which the structural formula is shown in FIG. 2, which has free hydroxyl groups. Depending on m, n, o, different physical and chemical properties are achieved. The molar mass or the degree of polymerisation, respectively, exhibits great importance for the thermal and mechanical properties and for the viscosity in solution.

The polymeric polyol can as well be a mixture of the above-mentioned examples of polymeric polyols.

The second component is a curable resin in the form of an epoxy resin. The second component can as well be a mixture of an epoxy resin and an isocyanate.

The reaction between the polymer polyol and the curable resin, is called hardening, setting or cross-linking. If a solvent is present, the reaction is started after flashing off the solvent. The reaction is carried out by ultra violet (UV) radiation treatment, for example with a commercially available mercury discharge lamp.

Figure 3:
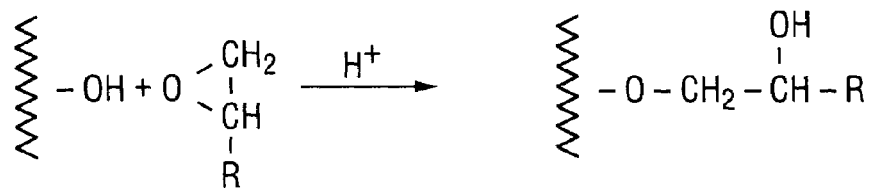
FIG. 3 shows the reaction of polyvinyl butyral with an epoxy resin.

The reaction of polyvinyl butyral with an epoxy resin is shown schematically in FIG. 3.

The curable resin is an epoxy resin. The epoxy resin incorporated in the barrier layer can be an aliphatic, cycloaliphatic or aromatic epoxide, with aliphatic and cycloaliphatic, i.e. ring epoxidised, epoxides being preferred. Advantageously, the epoxy resin consists of ≧70% by weight of an aliphatic and/or cycloaliphatic epoxide.

In particular, epoxidised polybutadiene or epoxidised soy bean oil is the aliphatic epoxide; further usable epoxides are, for example, dodecene oxide and diglycidyl ester of hexahydrophthalic acid. The cycloaliphatic epoxides are preferably diepoxides. Such diepoxides are, for example, 3,4-epoxycyclohexylmethyl-3',4'-epoxycyclohexanecarboxylate (EEC) and bis (3,4-epoxycyclohexylmethyl)adipate. Other such epoxides are for example compounds where the aliphatic chain of the adipic acid derivative, consisting of 4 methylene units, is substituted by a chain with 5 to 15 methylene units.

The underlying hardening chemistry is the cationic polymerisation of epoxy resins and the copolyaddition with suitable polyhydroxyl compounds. PVB is a hydroxyl compound of that kind and therefore is chemically incorporated or participates in the cross-link formation of the resulting high quality moulding material. The resulting moulding material is duroplastic, shows a good adhesion and demonstrates good tensile strength and elasticity. Furthermore it has a good light transmitting capacity, which makes it especially suitable for the use in solar cells and light emitting components.

By means of the capability to trigger the cross-linking by UV light a quick hardening of the lacquer layer is possible. The hardening is not triggered purely thermally, so that the formulations have an almost unlimited usable life, when short wave light is excluded. This provides flexibility for the application process and facilitates the automation of the latter. Normally neither vacuum nor a high temperature process is necessary for application and hardening. Only for the acceleration of flashing off a possibly present solvent and for the acceleration of the final hardening after exposure to UV, a slight increase of the temperature may be useful.

The PVB containing curable resin is exposed to UV light by means of a lamp or of a laser at a wavelength that preferably corresponds to the absorption of the photoinitiator contained in the curable resin. In the exemplary case the exposition is done with a mercury discharge lamp with a power density of 100 mW/cm$^2$ within the UV A range, at an radiation period of 20 seconds. By means of a following thermal treatment at 60° C. for the duration of 20 minutes the barrier effect against water and oxygen is additionally improved.

A suitable liquid resin composition for the barrier according to the present invention contains epoxy compounds, particularly diepoxides (30 to 95% by weight of the composition), polyvinyl butyral, suitably 1 to 15% by weight of the composition, and photoinitiators. Optionally also lacquer additives like antifoaming agents, levelling agents and/or adhesion promoting agents can be contained. Depending on the application process, they can additionally contain solvents, which are flashed off prior to an UV hardening.

Depending on the OH group contents, PVB is further cross-linked with other reaction partners. In practical use, reactants like epoxy resins, phenol resins and melamine resins are used. For other applications correspondingly catalysed phenol carbamide resins or melamine resins, and polyisocyanates and dialdehydes can be used as co-reactants. A thermal hardening also can take the place of UV hardening here.

By the special, cationically initiated hardening of the curable resin, i.e. the UV hardening, to a certain extent 'one' polymeric molecule is obtained, which is free from low molecular degassable components which impair the capacity of the component to be protected. Advantageously a thermal treatment, preferably up to a temperature of 120° C., can follow the UV hardening. In general, the lower temperature limit lies at 10 to 20° C. below the glass-transition temperature of the hardened curable resin. By means of the thermal treatment (post-hardening) the barrier effect of the barrier layer against water and oxygen can be further increased.

In particular, the resin is UV-curable, i.e. it sets under the influence of UV light. In the present application UV curable epoxy resins are particularly suitable.

The amount of polymeric polyol is suitably more than 1% by weight of the curable resin, in particular more than 5% by weight. Preferably the amount of polymeric polyol proportion is in the range of from 1% by weight to 15% by weight of the curable resin, but can be up to 30% by weight of the curable resin.

The barrier layer preferably consists almost completely of the reaction product of the curable resin and the polymeric polyol.

The barrier layer may be applied in known procedures as an impermeable layer, i. e. being free from pores, optically transparent and edge covering. Depending on the impermeability or freeness from pores such a layer is manufactured with a barrier layer having a thickness of 1 micrometre can already be sufficient to ensure a sufficient protection against moisture. Of course, a thicker barrier layer is possible. For application processes where barrier layers are obtained which are not quite free of pores or not completely homogenous or do not cover the rims well, preferably a larger thickness of the barrier layer is selected. When high topographic steps are present on the layered structure, a layer thickness of up to approximately 2 mm is selected for a good edge covering of the barrier layer.

By the addition of the polymeric polyol to the curable resin, particularly the film forming properties of the curable resin are improved. Moreover, PVB layers or other polymeric polyol layers are very often used as lamination layers during the assembly of components or during the manufacture of solar cells. Such barrier layers form a particularly close connection to the barrier layer made of polymeric polyol containing curable resin, since they excellently couple to the polymeric polyol within the curable resin.

The barrier layer is formed as a barrier layer for protection against moisture and is located at least at one outer surface of the component, which outer surface is the outer surface of the layered structure and at least part of the surface of the substrate that is not covered by the layered structure.

With such a barrier layer made of a curable resin containing polymeric polyol for example thin film solar modules can be constructed which pass the damp-heat climate test mentioned at the beginning with a performance loss of less than 5% and without visible corrosion damage.

Since the barrier layer according to the present invention adapts to the function of the covered layered structure and, for example, is optically transparent or electrically insulating, it shows no negative influence to the layered structure. Neither does it affect the operation of an optical or electrical component that is incorporated in the layered structure nor does it impair the properties thereof.

The barrier layer demonstrates good adhesion on most materials that are used as an electrical or optical function layer or the substrate. Possibly an additional adhesion providing layer may be necessary.

Since a layered structure can comprise the barrier layer as an additional layer to the conventional layered structure comprising one or any number of layers, it can further be covered with a conventional covering, for example with a laminate. Thus, a laminate consisting of a glass plate and an intermediate adhesive layer can also be provided on top of the barrier layer covering the layered structure. Other components can additionally or alternatively be covered with or enveloped in cast resin layers or other casting compounds on top of the barrier layer.

The barrier layer according to the invention is especially suitable for applying a laminate covering it, as it demonstrates good adhesion on or under conventional hot melt adhesive layers, used therefore. This results from the close connection between polymeric polyol and laminate. The good adhesion of the hot melt adhesive film, and hence of the entire laminate structure, results in an additional improved impermeability, which prevents diffusion of moisture along the interfaces between layered structure and laminate or between barrier layer and laminate, respectively.

Preferably the barrier layer encloses the layered structure that is sensitive to moisture from above and from the side and ends at the lower edge on the substrate that for example consists of glass. The barrier layer according to the present invention can also cover a metal layer or a passivation layer. The passivation layer can also be an inorganic barrier layer. Suitable materials for a passivation layer are silicon oxide, titanium nitride and molybdenum nitride. The latter two are particularly hard and scratch resistant as well. The barrier layer of the present invention demonstrates good adhesion to all the layers and thus form moisture-impermeable and chemically stable interfaces to these layers.

In one embodiment of the invention the layered structure is an electrical component having at least two electrodes wherein one electrode is formed by an electrode layer located directly on the substrate. This electrode is called a back electrode, and the back electrode can be structured, to obtain an electrode structure that is particularly suitable for integrated series connected thin film solar modules.

In addition to the necessary electrode structure also the electrical connections for the at least two electrodes can be formed from this back electrode layer and led out of the component region laterally. Such an arrangement has the advantage that it can be formed particularly flat without additional structure steps, as opposed to a conventional arrangement with, for example, electrical connections soldered on. This facilitates an edge covering envelopment with the barrier layer according to the invention.

The electrical connections led out of the layered structure of the component under the barrier layer and formed from the first electrode layer can consist of a corrosion resistant metal. Preferably, however, they are covered by an electrical conductive passivation layer, in particular a titanium nitride or a molybdenum nitride layer. The passivation layer can completely cover the lower electrode layer and be structured in accordance therewith. It is also possible to cover the lower electrode layer with passivation layer exclusively in the region of the electrical connections, and in particular only in the area of the lead through the connections under the barrier layer.

Another advantageous embodiment of the invention relates to the already mentioned CIS thin film solar modules. As known, for example, from the German patent No. DE 44 42 824 C1, a defined alkali content in the CIS absorber layer is necessary for a maximum efficiency of the solar cell. Since with the use of a glass substrate a defined alkali content of the CIS absorber layer can only be achieved with an alkali barrier layer directly above the glass substrate or above the back electrode layer, a barrier layer according to the invention, formed as a passivating layer above the back electrode can be used for such a barrier layer in a favourable manner. Simultaneously, a barrier layer made of titanium or molybdenum nitride can serve as a passivation layer for the electrical connections leading to the outside, or as a barrier layer for the entire lower electrode, respectively. It exhibits particularly good adhesion to an additional barrier layer above the solar cell and forms a particularly good and impermeable interface to the barrier layer therewith.

The invention will now further be described by way of example with reference to some experiments. In order to get reproducible results Applicant has carried out the damp-heat test on a special component comprising a glass substrate on which doped electrode zinc oxide has been deposited by means of chemical vapour deposition. The test components were equipped with electrodes, and the sheet resistance was measured. In order to achieve a fill factor with solar modules, however, a lower value is necessary.

Figure 4:
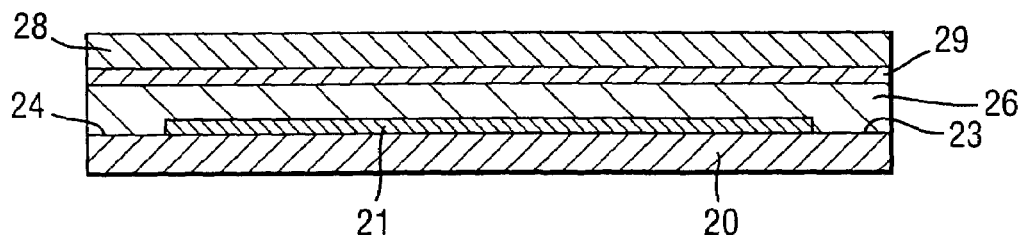
FIG. 4 shows schematically and not to scale cross-section through a component that was used in test.

Reference is now made to FIG. 4 showing schematically a cross-section of the test component. On a substrate 20 of a 2 mm thick window glass plate soda lime glass (having a length of 10 cm and a width of 10 cm) a boron doped zinc oxide layer 21 having a thickness of 1.5 micrometre is applied by means of chemical vapour deposition. After application of the zinc oxide layer, strips of zinc oxide of 10 mm width are removed from the substrate 20, so as to make four uncovered rims of which rims 23 and 24 are shown in FIG. 4. Then two metallic contact strips (not shown) are joined to the zinc oxide layer on opposite sides thereof, so that the sheet resistance of the zinc oxide layer can be determined reliably.

Having applied the contact strips, a barrier layer 26 was applied, as will be discussed below. Thereafter a glass cover 28 was adhered to the barrier layer by means of an adhesive layer of polyvinyl butyral 29. The adhesive layer 29, having a thickness of 0.5 mm, was allowed to set under 145° C. for 30 minutes under pressure. The pressure was applied on the glass cover 28 by means of a membrane (not shown) separating a vacuum chamber (with the component in it) and a pressurized chamber, and the pressure difference over the membrane was 450 millibar.

In order to show the effectiveness of the barrier layer according to the invention four experiments were carried out to determine the sheet resistance of a zinc oxide layer under the damp-heat test. In this test the modules are exposed to a temperature of 85° C. at 85% relative air humidity for 1 000 hours.

The barrier layer according to the present invention was prepared as follows. First a liquid resin composition was prepared. The liquid resin composition consisted of: 35 g polyvinyl butyral, 357 g cycloaliphatic epoxy resin, 236 g OH-134, consisting of bisphenol A and cycloaliphatic epoxy resin Araldit CY 179 in the proportion of 1:3, 157 g epoxidized soy bean oil, 197 g trifunctional polyester polyol, 9.8 g triarylsulphonium hexafluoroantimonate, 3.9 g (3-glycidoxypropyl)-trimethoxysilane, 3.4 g dimethylpolysiloxane derivative.

Then the liquid resin composition was brushed over the component so as to cover the zinc oxide layer and the rims 23 and 24 around the zinc oxide layer. And under UV conditions, the resin composition was allowed to harden.

Then the electric connections were made (not shown) to the metallic contact strips (not shown) and the test component was put in a container for the damp-heat test. During the test the sheet resistance was measured.

In order to compare the obtained result, comparative experiments were conducted. At first, the component was not covered with a barrier layer.

Then two comparative experiments were conducted with barrier layers consisting of a conventional resin. In the first comparative experiment, the barrier layer was made using a liquid resin composition consisting of a two-component lacquer 1640 (from Rhenatech Elektroisoliersysteme)—comparative example A. And in the second comparative experiment, the barrier layer was made using a liquid UV-curable acrylate resin composition Multi-Cure 984 (Trade name) LVUF (from Dymax Europe GmbH)—comparative example B.

The resin compositions were brushed on test components as discussed with reference to the composition according to the invention and allowed to harden.

Then the sheet resistance of the three test components were measured under the same conditions as the sheet resistance of the component according to the invention was measured. The sheet resistances were normalized so that the initial sheet resistance was 1 for all components.

The results are shown in the below Table.

TABLE

Normalized sheet resistances measured of zinc oxide measured with the barrier layer according to the invention and three comparative examples.

| Time (hours) | According to the invention | No barrier layer | Comparative example A | Comparative example B |
|---|---|---|---|---|
| 0 | 1.0 | 1.0 | 1.0 | 1.0 |
| 200 | 1.0 | 1.7 | 1.1 | 1.0 |
| 400 | 1.1 | 3.0 | 1.7 | 1.2 |
| 600 | 1.4 | 4.1 | 2.5 | 1.4 |
| 800 | 1.5 | 4.8 | 3.2 | 2.0 |
| 1000 | 1.8 | 5.7 | 4.2 | 2.9 |

The Table shows the improvement obtained with the barrier layer according to the present invention.

With the invention, the climate and corrosion stable encapsulation of any layered structure and in particular thin film arrangements with a large surface, which comprise climate and corrosion sensitive layers, can successfully be done. The invention is particularly suitable for such thin film arrangements that are exposed to hot and/or humid environments, such as solar cells. Of course this is also valid for layered structures that are usually not exposed to such corrosion promoting environmental conditions.

We claim:

1. A component comprising a substrate, a layered structure arranged on the substrate, and a barrier layer arranged over the layered structure for protection against moisture, wherein the layered structure includes an optically active film and wherein the barrier layer comprises the reaction product of polymeric polyol in the form of polyvinyl butyral, and a curable epoxy resin, wherein the amount of polymeric polyol is in the range of from 1% to 30% by weight of the curable epoxy resin.

2. The component of claim 1, wherein the barrier layer is located at least at one outer surface of the component.

3. The component of claim 2, wherein the layered structure comprises an edge at its outer surface and wherein the barrier layer covers the edge.

4. The component of claim 1, wherein the barrier layer is impermeable to moisture.

5. The component of claim 4, wherein the layered structure comprises an edge at its outer surface and wherein the barrier layer covers the edge.

6. The component of claim 1, wherein the component further comprises a laminate structure with a cover and an intermediate adhesive layer that is arranged over the barrier layer.

7. The component of claim 6, wherein the cover comprises at least one plastic layer.

8. The component of claim 6, wherein the cover is a glass plate.

9. The component of claim 6, wherein the intermediate adhesive layer consists of polyvinyl butyral.

10. The component of claim 1, wherein the curable epoxy resin is UV curable.

11. The component of claim 1, wherein the barrier layer covers the layered structure on a top surface facing away from the substrate and on a side, and ends on the substrate.

12. The component of claim 1, which component is a solar cell or a solar module.

13. The component of claim 1, wherein the layered structure comprises a moisture-sensitive absorber layer.

14. The component of claim 13, wherein the moisture-sensitive absorber layer comprises copper-indium-diselenide.

15. A solar cell comprising a substrate, a layered structure arranged on the substrate, and a barrier layer arranged over the layered structure for protection against moisture, wherein the barrier layer comprises the reaction product of a polymeric polyol and an epoxy resin, and wherein the amount of polymeric polyol is in the range of from 1% to 30% by weight of the epoxy resin.

16. The solar cell of claim 15, wherein the wherein the layered structure includes an optically active film.

17. The solar cell of claim 16, wherein the optically active film comprises a moisture-sensitive absorber layer.

18. The solar cell of claim 17, wherein the moisture-sensitive absorber layer comprises copper-indium-diselenide.

19. The solar cell of claim 15, wherein the polymeric polyol comprises polyvinyl butyral.

20. The solar cell of claim 15, further comprising a cover and an intermediate adhesive layer that is arranged over the barrier layer.

21. A solar module comprising a substrate, a layered structure arranged on the substrate, and a barrier layer arranged over the layered structure for protection against moisture, wherein the barrier layer comprises the reaction product of a polymeric polyol and an epoxy resin, and wherein the amount of polymeric polyol is in the range of from 1% to 30% by weight of the epoxy resin.

* * * * *